(12) United States Patent
Yang

(10) Patent No.: US 8,860,492 B2
(45) Date of Patent: Oct. 14, 2014

(54) SWITCHED CAPACITOR CIRCUIT UTILIZING DELAYED CONTROL SIGNAL AND INVERTING CONTROL SIGNAL FOR PERFORMING SWITCHING OPERATION AND RELATED CONTROL METHOD

(71) Applicant: Realtek Semiconductor Corp., HsinChu (TW)

(72) Inventor: Yu-Che Yang, Yilan County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 13/861,363

(22) Filed: Apr. 11, 2013

(65) Prior Publication Data

US 2013/0271200 A1 Oct. 17, 2013

(30) Foreign Application Priority Data

Apr. 17, 2012 (TW) .............................. 101113576 A

(51) Int. Cl.
*H03K 17/28* (2006.01)
*H03H 19/00* (2006.01)

(52) U.S. Cl.
CPC .............. *H03K 17/28* (2013.01); *H03H 19/004* (2013.01)
USPC ............................... 327/337; 327/554; 327/19

(58) Field of Classification Search
CPC .............. H03H 19/004; H03H 21/0007; H03J 2200/10
USPC ...................... 327/91, 94, 337, 390, 554, 589
See application file for complete search history.

(56) References Cited

U.S. PATENT DOCUMENTS

| | | | | |
|---|---|---|---|---|
| 5,059,816 | A * | 10/1991 | Kobatake | 327/589 |
| 6,501,326 | B2 * | 12/2002 | Fujii et al. | 327/536 |
| 7,710,181 | B2 * | 5/2010 | Nakatani et al. | 327/308 |
| 7,979,040 | B2 * | 7/2011 | Okanobu | 455/180.2 |
| 8,044,739 | B2 * | 10/2011 | Rangarajan et al. | 331/167 |
| 2005/0174184 | A1 * | 8/2005 | Wu | 331/176 |
| 2007/0247237 | A1 * | 10/2007 | Mohammadi | 331/36 C |
| 2008/0129398 | A1 * | 6/2008 | Sun et al. | 331/117 FE |
| 2010/0019826 | A1 * | 1/2010 | Yeh | 327/337 |
| 2012/0081262 | A1 * | 4/2012 | Tanaka et al. | 343/876 |
| 2012/0223771 | A1 * | 9/2012 | Zhang | 327/586 |
| 2012/0286888 | A1 * | 11/2012 | Hsieh et al. | 331/117 FE |

* cited by examiner

*Primary Examiner* — Thomas J Hiltunen
(74) *Attorney, Agent, or Firm* — Winston Hsu; Scott Margo

(57) ABSTRACT

A switched capacitor circuit includes an inverter, a first capacitor, and a first switch unit. The inverter is arranged to receive a control signal to generate an inverting control signal corresponding to the control signal. The first capacitor is coupled between a first output port and a first node. The first switch unit is arranged to receive a first input signal and a second input signal, and selectively couple the second input signal to the first node according to the first input signal. The first input signal is determined by one of the control signal and the inverting control signal, and the second input signal is determined by the other of the control signal and the inverting control signal.

15 Claims, 6 Drawing Sheets

US 8,860,492 B2

SWITCHED CAPACITOR CIRCUIT UTILIZING DELAYED CONTROL SIGNAL AND INVERTING CONTROL SIGNAL FOR PERFORMING SWITCHING OPERATION AND RELATED CONTROL METHOD

BACKGROUND OF THE INVENTION

1. Field of the Invention

The disclosed embodiments of the present invention relate to a switched capacitor circuit, and more particularly, to a switched capacitor circuit utilizing a delayed control signal and an inverting control signal for performing switching operations and related control method thereof.

2. Description of the Prior Art

In a modern communication system, a local oscillation (LO) signal is generated mainly by a voltage-controlled oscillator (VCO). Regarding a VCO including an inductor-capacitor tank (LC tank) circuit, the VCO can provide an accurate LO signal to improve the sensitivity of radio frequency (RF) transceivers due to its high quality factor and signal purity.

In general, an on-chip inductor occupies a large area. Therefore, an oscillation frequency of a VCO is varied by adjusting capacitance values in most cases, where a switched capacitor array is used to generate discrete switch capacitance values according to switch voltages. However, a junction capacitance effect may occur in a switched capacitor circuit of the switched capacitor array. Besides, when coupled to voltages of output ports, transistors in the switched capacitor circuit may turn on accidentally, thus degrading the performance of the VCO.

Thus, there is a need for an innovative circuit design, which can improve the switching quality of the switched capacitor circuit with no increase or negligible increase in the layout area, to solve the abovementioned problems.

SUMMARY OF THE INVENTION

It is one objective of the present invention to provide a switched capacitor circuit, which utilizes a delayed control signal and an inverting control signal for performing switching operations, and related control method thereof to solve the abovementioned problems.

According to an embodiment of the present invention, an exemplary switched capacitor circuit is disclosed. The exemplary switched capacitor circuit includes an inverter, a first capacitor and a first switch unit. The inverter is arranged to receive a control signal to generate an inverting control signal corresponding to the control signal. The first capacitor is coupled between a first output port and a first node. The first switch unit is arranged to receive a first input signal and a second input signal, and selectively couple the second input signal to the first node according to the first input signal. The first input signal is determined by one of the control signal and the inverting control signal, and the second input signal is determined by the other of the control signal and the inverting control signal.

According to another embodiment of the present invention, another exemplary switched capacitor circuit is disclosed. The exemplary switched capacitor circuit includes an inverter, a capacitor and a switch unit. The inverter is arranged to generate an inverting control signal according to a control signal. The capacitor is coupled between an output port and a node. The switch unit has a drain coupled to the node, a source for receiving the inverting control signal, and a gate controlled by the control signal.

According to an embodiment of the present invention, an exemplary method for controlling a switched capacitor circuit is disclosed. The switched capacitor circuit comprises a capacitor. The capacitor is coupled between an output port and a node. The exemplary method comprises: receiving a control signal; generating an inverting control signal corresponding to the control signal according to the control signal; and selectively coupling a second input signal to the node according to a first input signal, wherein the first input signal is determined by one of the control signal and the inverting control signal, and the second input signal is determined by the other of the control signal and the inverting control signal.

The proposed switched capacitor circuit, which utilizes a delayed control signal and an inverting control signal for performing switching operations, can have a high quality factor of the differential switched capacitor circuit, avoid the junction capacitance effect in the VCO application, and prevent the switch unit from accidentally turning on. Moreover, there is almost no increase in the layout area when the proposed switched capacitor circuit is employed. Besides, there is no complicated circuit configuration required.

These and other objectives of the present invention will no doubt become obvious to those of ordinary skill in the art after reading the following detailed description of the preferred embodiment that is illustrated in the various figures and drawings.

DETAILED DESCRIPTION

Advantages of switched capacitor circuits disclosed in the present invention are described with reference to an application of using the LC tank circuit in the VCO. However, this is for illustrative purposes only, and is not meant to be a limitation of the present invention. In other words, the switched capacitor circuits disclosed in the present invention are applicable to, but not limited to, VCOs, resonant tank circuits or other frequency-adjustable switched capacitor array circuits.

Figure 1:
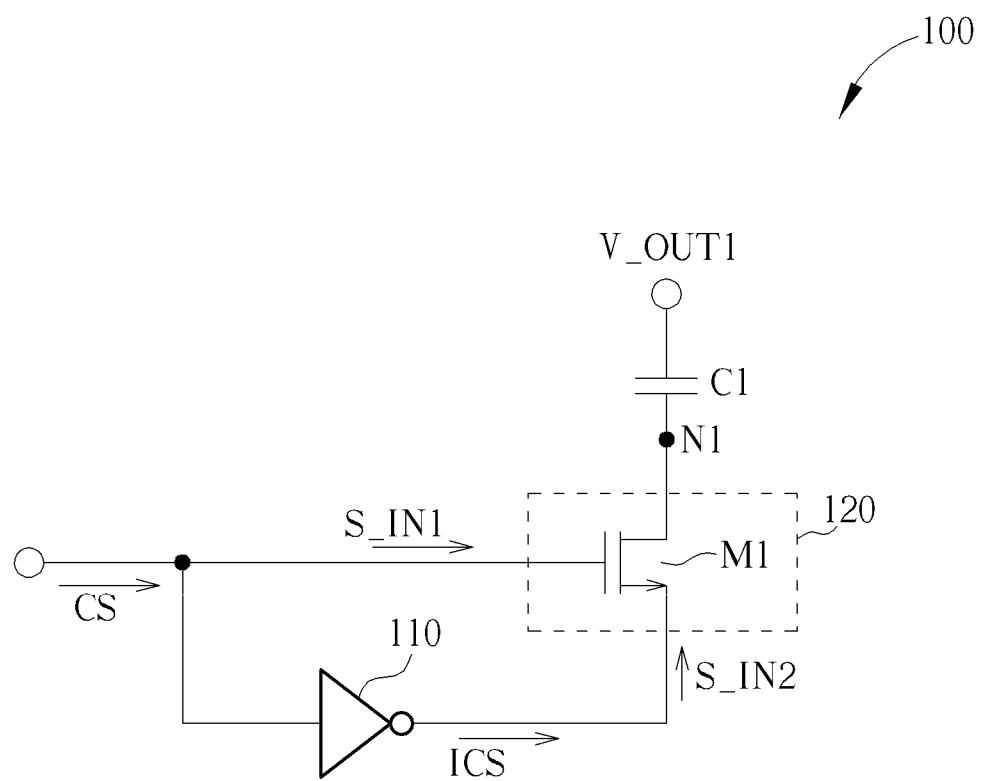
FIG. 1 is a diagram illustrating an exemplary switched capacitor circuit according to a first embodiment of the present invention.

Please refer to FIG. 1, which is a diagram illustrating an exemplary switched capacitor circuit according to a first embodiment of the present invention. The switched capacitor circuit 100 includes an inverter 110, a first capacitor C1 and a first switch unit 120. The inverter 110 is arranged to receive a control signal CS to generate an inverting control signal ICS corresponding to the control signal CS. The first capacitor C1 is coupled between a first output port V_OUT1 and a first node N1. The first switch unit 120 is arranged to receive a first input signal S_IN1 and a second input signal S_IN2, and selectively couple the second input signal S_IN2 to the first node N1 according to the first input signal S_IN1, wherein the first input signal S_IN1 is determined by one of the control signal CS and the inverting control signal ICS, and the second input signal S_IN2 is determined by the other of the control signal CS and the inverting control signal ICS.

By way of example, the first switch unit 120 in this embodiment may be a transistor M1 whose gate, source and drain are coupled to the first input signal S_IN1, the second input signal S_IN2 and the first node N1, respectively. Please note that, in this embodiment, the first switch unit 120 directly receives the control signal CS as the first input signal S_IN1, and directly receives the inverting control signal ICS as the second input signal S_IN2. However, this is for illustrative purposes only, and is not meant to be a limitation of the present invention. In an alternative design, the switch unit 120 may directly receive the inverting control signal ICS as the first input signal S_IN1, and directly receive the control signal CS as the second input signal S_IN2. To put it another way, the inverter 110 may be coupled to the gate of the transistor M1. In another alternative design, the control signal CS may be properly processed (e.g., amplified or attenuated) before fed into the first switch unit 120 to serve as the first input signal S_IN1, and the inverting control signal ICS may be properly processed (e.g., amplified or attenuated) before fed into the first switch unit 120 to serve as the second input signal S_IN2. In this embodiment, in a case where the first input signal S_IN1 (i.e., the control signal CS) is at a first level (e.g., a high voltage level), the second input signal S_IN2 (i.e., the inverting control signal ICS) coupled to the source of the transistor M1 is at a low voltage level. Therefore, the transistor M1 may be turned on, resulting in a current flowing from the first node N1 to the transistor M1 (i.e., the first switch unit 120). In a case where the first input signal S_IN1 (i.e., the control signal CS) is at a second level (e.g., a low voltage level), the second input signal S_IN2 (i.e., the inverting control signal ICS) coupled to the source of the transistor M1 is at a high voltage level. Therefore, even if the transistor M1 is turned off, leakage current is still allowed to flow from the transistor M1 (i.e., the first switch unit 120) to the first node N1 to increase a voltage of the first node N1, which may reduce/alleviate the junction capacitance effect.

Figure 2:
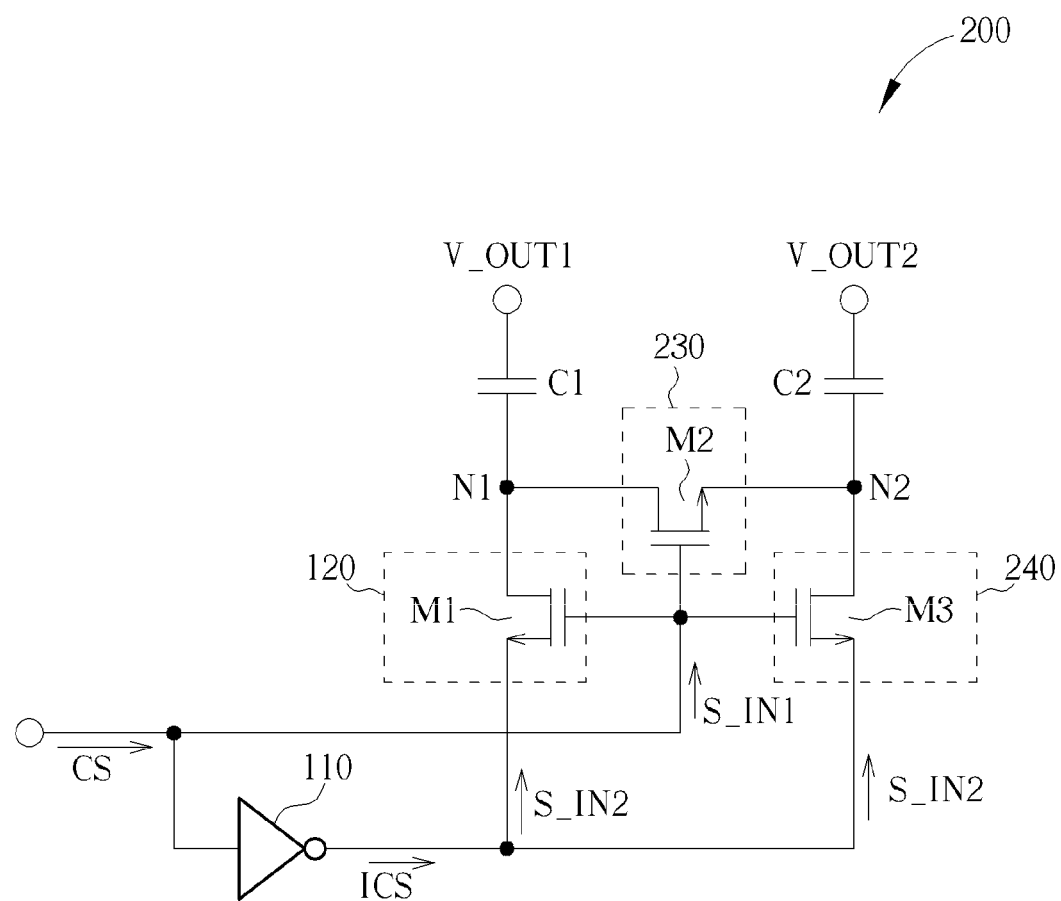
FIG. 2 is a diagram illustrating an exemplary switched capacitor circuit according to a second embodiment of the present invention.

Please refer to FIG. 2, which is a diagram illustrating an exemplary switched capacitor circuit according to a second embodiment of the present invention. The switched capacitor circuit 200 uses the design concept of a differential circuit and the design concept of the switched capacitor circuit 100 shown in FIG. 1. The switched capacitor circuit 200 includes the inverter 110, first capacitor C1 and first switch unit 120 shown in FIG. 1, and further includes a second capacitor C2, a second switch unit 230, and a third switch unit 240. The second capacitor C2 is coupled between a second output port V_OUT2 and a second node N2. The second switch unit 230 is coupled between the first node N1 and the second node N2, and arranged to selectively couple the first node N1 to the second node N2 according to the first input signal S_IN1. The third switch unit 240, coupled to the second node N2, is arranged to receive the first input signal S_IN1 and the second input signal S_IN2 and selectively couple the second input signal S_IN2 to the second node N2 according to the first input signal S_IN1. It should be noted that the first input signal S_IN1 is determined by one of the control signal CS and the inverting control signal ICS, and the second input signal S_IN2 is determined by the other of the control signal CS and the inverting control signal ICS.

By way of example, the first switch unit 120, the second switch unit 230 and the third switch unit 240 in this embodiment are a first transistor M1, a second transistor M2 and a third transistor M3, respectively. Gates of the first, the second and the third transistors M1-M3 are all coupled to the first input signal S_IN1, drains of the first and the second transistors M1 and M2 are both coupled to the first node N1, sources of the first and the third transistors M1 and M3 are both coupled to the second input signal S_IN2, and a source of the second transistor M2 and a drain of the third transistor M3 are both coupled to the second node N2. In a case where the first input signal S_IN1 (i.e., the control signal CS) is at a first level (e.g., a high voltage level), the second input signal S_IN2 (i.e., the inverting control signal ICS), coupled to the sources of the first transistor M1 and the third transistor M3, is at a low voltage level. Therefore, the first, the second and the third transistors M1-M3 may be turned on. In addition, the first capacitor C1 and the second capacitor C2 may be regarded as ideal grounded capacitors. In a case where the first input signal S_IN1 (i.e., the control signal CS) is at a second level (e.g., a low voltage level), the second input signal S_IN2 (i.e., the inverting control signal ICS), coupled to the sources of the first transistor M1 and the third transistor M3, is at a high voltage level. Therefore, even if the first, the second and the third transistors M1-M3 are turned off, leakage current is still allowed to flow from the first transistor M1 to the first node N1 to increase a voltage of the first node N1, and flow from the third transistor M3 to the second node N2 to increase a voltage of the second node N2, which may not only prevent the second transistor M2 from turning on but also reduce/alleviate the junction capacitance effect.

Figure 3:
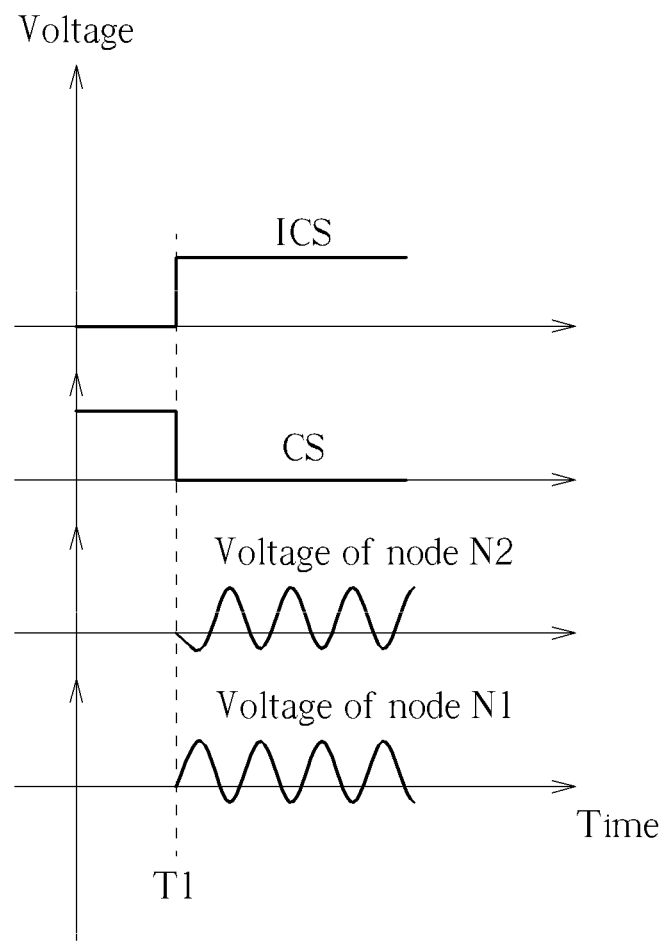
FIG. 3 is a timing diagram of the switched capacitor circuit shown in FIG. 2.

It should be noted that the voltage increase at the second node N2 due to the leakage current may be small (e.g., hundreds of milivolts). Thus, when the voltage of the second node N2 is coupled to a higher voltage through the second output port V_OUT2, the voltage of the second node N2 may still be lower than the gate voltage of the second transistor M2, which may cause the second transistor M2 to turn on accidentally. Please refer to FIG. 3, which is a timing diagram of the switched capacitor circuit 200 shown in FIG. 2. As shown in FIG. 3, the control signal CS is at a high voltage level before a time point T1. In addition, the first, the second and the third transistors M1-M3 are all turned on, and the voltages of the first node N1 and the second node N2 may be regarded as the grounded voltages (i.e., zero voltages). At the time point T1, the control signal CS is switched from the high voltage level to a low voltage level, which implies that the second transistor M2 should be cut off ideally. In a case where the voltages of the first and the second nodes N1 and N2 are coupled to higher voltages through the first and the second output ports V_OUT1 and V_OUT2, respectively, the voltage of the second node N2 is lower than the gate voltage (i.e., the zero voltage) of the second transistor M2, which causes the second transistor M2 to turn on accidentally. Thus, the oscillation frequency accuracy and the signal purity of the VCO may be affected.

Figure 4:
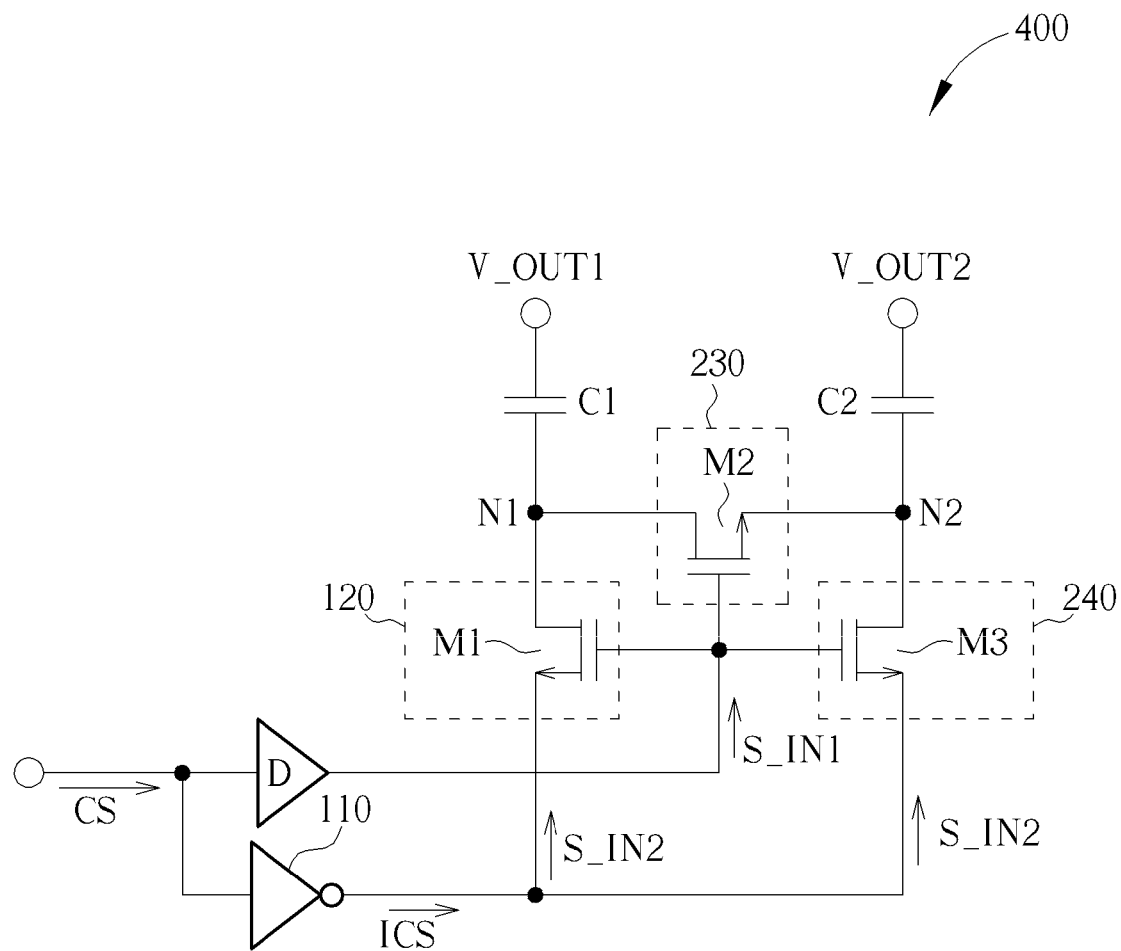
FIG. 4 is a diagram illustrating an exemplary switched capacitor circuit according to a third embodiment of the present invention.
Figure 5:
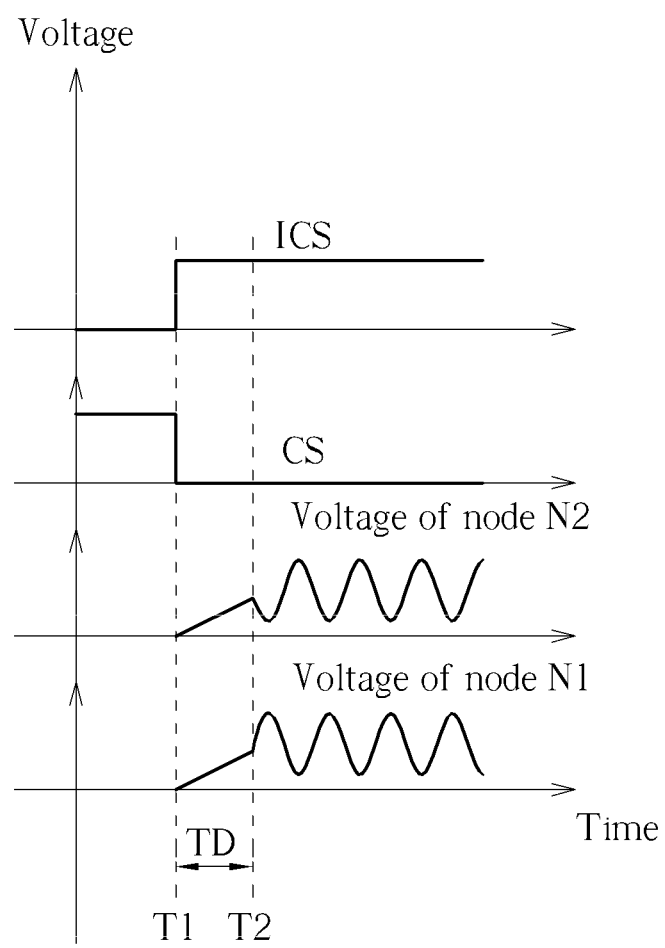
FIG. 5 is a timing diagram of the switched capacitor circuit shown in FIG. 4.

Please refer to FIG. 4 and FIG. 5 together. FIG. 4 is a diagram illustrating an exemplary switched capacitor circuit according to a third embodiment of the present invention, and FIG. 5 is a timing diagram of the switched capacitor circuit shown in FIG. 4. The architecture of the switched capacitor circuit 400 is based on that of the switched capacitor circuit 200 shown in FIG. 2, and the major difference therebetween is that the switched capacitor circuit 400 further includes a delay unit D, wherein the delay unit D is coupled to the first switch unit 120, the second switch unit 230 and the third switch unit 240, and configured to delay the first input signal S_IN1 to generate the delayed first input signal S_IN1. In addition, the second switch unit 230 selectively couples the first node N1 to the second node N2 according to the delayed first input signal S_IN1, and the third switch unit 240 selectively couples the second input signal S_IN2 to the second node N2 according to the delayed first input signal S_IN1. A delay time by which the first input signal S_IN is delayed, or a delay time caused by the delay unit D, may be determined according to an impedance of the first capacitor C1 and an impedance of the first switch unit 120, or determined according to an impedance of the second capacitor C2 and an impedance of the third switch unit 240.

As shown in FIG. 5, the control signal CS is at a high voltage level before a time point T1. In addition, the first, the second and the third transistors M1-M3 are all turned on, and the voltages of the first node N1 and the second node N2 may be regarded as the grounded voltages (i.e., zero voltages). During a period between the time point T1 and a time point T2 (i.e., during a delay period TD), although the control signal CS has been switched to a low voltage level, the signal received at the gate of the second transistor M2 is still at the high voltage level. In the meantime, the gates of the first transistor M1 and the third transistor M3 are both coupled to the inverting control signals ICS having the high voltage level. During the delay period TD, the voltages of the first node N1 and the second node N2 may be charged to a predetermined voltage (e.g., the aforementioned high voltage level). As mentioned above, the delay period TD may be determined according to the impedance of the first capacitor C1 and the impedance of the first switch unit 120, or determined according to the impedance of the second capacitor C2 and the impedance of the third switch unit 240. Therefore, the delay time caused by the delay unit D, as well as the predetermined voltage, may depend on the actual design considerations/requirements. In addition, the delay unit D is configured to prevent oscillation voltages of the first node N1 and the second node N2 from being lower than zero. After the time point T2, because the voltages of the first node N1 and the second node N2 have been charged to the predetermined voltage, and the gate of the second transistor M2 has received the delayed first input signal S_IN1 (having the low voltage level), the accidental turn-on of the second transistor M2 may be avoided. In brief, during the delay period TD, the voltages of the first node N1 and the second node N2 may be boosted to sufficiently high voltages to prevent the second transistor M2 from accidentally turning on, which improves the oscillation frequency accuracy and the signal purity.

Please note that the aforementioned corresponding relationship between the first and the second input signals and the control signal and the inverting control signal is for illustrative purposes only, and is not meant to be a limitation of the present invention. In an alternative design, the first switch unit 120 may directly receive the inverting control signal ICS as the first input signal S_IN1, and directly receive the control signal CS as the second input signal S_IN2. In other words, the inverter 110 is coupled to the gate of the first transistor M1, and the delay unit D is coupled to the sources of the first transistor M1 and the third transistor M3. In another alternative design, the delay unit D and the inverter 110 may be replaced or combined with each other.

Figure 6:
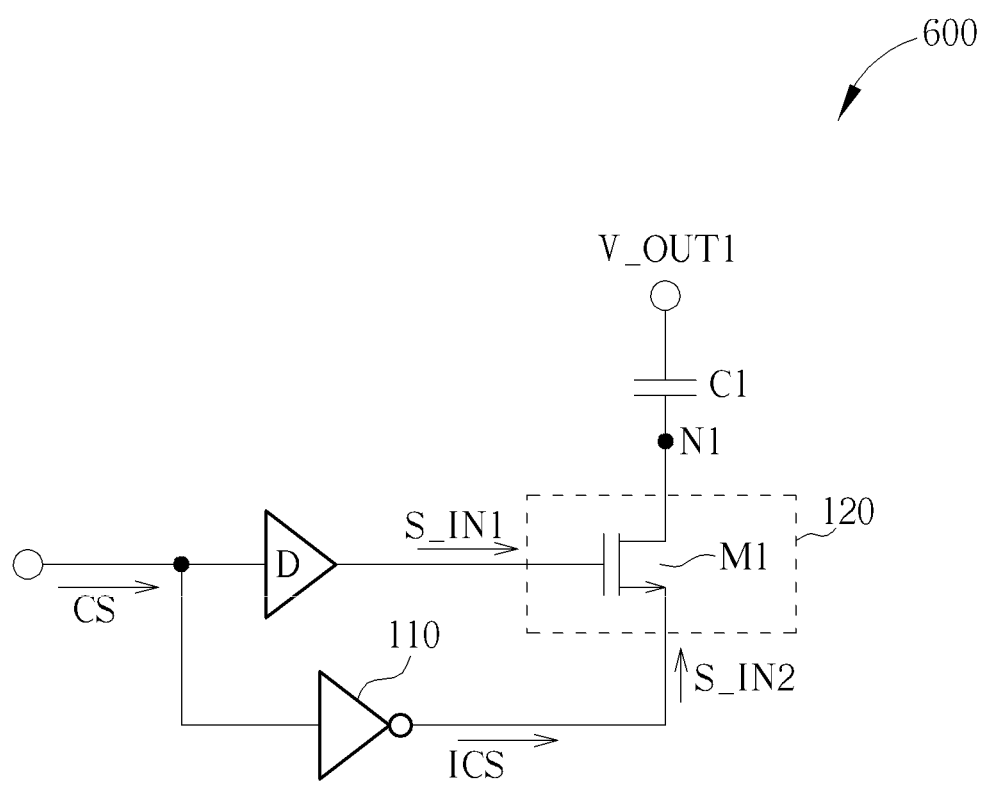
FIG. 6 is a diagram illustrating an exemplary switched capacitor circuit according to a fourth embodiment of the present invention.

Furthermore, the switched capacitor circuit 100 having a single-ended output shown in FIG. 1 may use the design concept of the delay unit shown in FIG. 4 to improve the performance of the VCO. Please refer to FIG. 6, which is a diagram illustrating an exemplary switched capacitor circuit according to a fourth embodiment of the present invention. The architecture of the switched capacitor circuit 600 is based on that of the switched capacitor circuit 100 shown in FIG. 1, and the major difference therebetween is that the switched capacitor circuit 600 further includes a delay unit D, wherein the delay unit D is coupled to the first switch unit 120, and configured to delay the first input signal S_IN1 to generate the delayed first input signal S_IN1. In addition, the first switch unit 120 selectively couples the second input signal S_IN2 to the first node N1 according to the delayed first input signal S_IN1, wherein a delay time by which the first input signal S_IN is delayed may be determined according to an impedance of the first capacitor C1 and an impedance of the first switch unit 120. As a person skilled in the art can readily understand the operation of the switched capacitor circuit 600 after reading above paragraphs, further description is omitted for brevity.

As can be known from above descriptions, it should be appreciated that the proposed switched capacitor circuit may be applicable to, but not limited to, VCOs, resonant tank circuits or other frequency-adjustable switched capacitor array circuits. Therefore, employing the proposed switched capacitor circuit may avoid the junction capacitance effect in the VCO application, improve the qualify factor of the VCO, and prevent the switch unit from accidentally turning on. Moreover, there is almost no increase in the layout area when the proposed switched capacitor circuit is employed. Besides, there is no complicated circuit configuration required.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switched capacitor circuit, comprising:
   an inverter, for receiving a control signal to generate an inverting control signal corresponding to the control signal;
   a first capacitor, coupled between a first output port and a first node;
   a delay unit, for delaying a first input signal to generate the delayed first input signal; and
   a first switch unit, coupled to the delay unit, the first switch unit arranged for receiving the delayed first input signal and a second input signal, and selectively coupling the second input signal to the first node according to the delayed first input signal;
   wherein the first input signal is determined by one of the control signal and the inverting control signal, and the second input signal is determined by the other of the control signal and the inverting control signal; and after a signal level of the control signal is switched, the first switch unit receives the delayed first input signal corresponding to the control signal with the switched signal level at a time later than a time at which the first switch unit receives the second input signal corresponding to the control signal with the switched signal level.

2. The switched capacitor circuit of claim 1, wherein the first switch unit is a transistor, and a gate, a source and a drain of the transistor is coupled to the first input signal, the second input signal and the first node, respectively.

3. The switched capacitor circuit of claim 1, wherein a delay time by which the first input signal is delayed is determined according to an impedance of the first capacitor and an impedance of the first switch unit.

4. The switched capacitor circuit of claim 1, wherein the delay unit is configured to prevent an oscillation voltage of the first node from being lower than zero.

5. The switched capacitor circuit of claim 1, further comprising:
   a second capacitor, coupled between a second output port and a second node;

a second switch unit, coupled to the delay unit and coupled between the first node and the second node, for selectively coupling the first node to the second node according to the delayed first input signal; and a third switch unit, coupled to the delay unit and coupled to the second node, for receiving the first input signal and the second input signal, and selectively coupling the second input signal to the second node according to the delayed first input signal.

6. The switched capacitor circuit of claim 5, wherein the first switch unit, the second switch unit and the third switch unit are a first transistor, a second transistor and a third transistor, respectively; gates of the first, the second and the third transistors are coupled to the first input signal; drains of the first and the second transistors are coupled to the first node; sources of the first and the third transistors are coupled to the second input signal; and a source of the second transistor and a drain of the third transistor are coupled to the second node.

7. The switched capacitor circuit of claim 5, wherein a delay time by which the first input signal is delayed is determined according to an impedance of the first capacitor and an impedance of the first switch unit, or determined according to an impedance of the second capacitor and an impedance of the third switch unit.

8. The switched capacitor circuit of claim 1, wherein when the first switch unit is turned off according to the delayed first input signal, the second input signal is not coupled to the first node except through a leakage current path of the first switch unit.

9. A switched capacitor circuit, comprising:
an inverter, for generating an inverting control signal according to a control signal;
a capacitor, coupled between an output port and a node;
a delay unit, configured to delay the control signal to generate the delayed control signal; and
a switch unit, coupled to the switch unit, wherein the switch unit has a drain coupled to the node, a source for receiving the inverting control signal, and a gate controlled by the delayed control signal;
wherein the switch unit selectively couples the inverting control signal to the node according to the delayed control signal; and after a signal level of the control signal is switched, the gate receives the delayed control signal corresponding to the control signal with the switched signal level at a time later than a time at which the source receives the inverting control signal corresponding to the control signal with the switched signal level.

10. The switched capacitor circuit of claim 9, wherein a delay time by which the control signal is delayed is determined according to an impedance of the capacitor and an impedance of the switch unit.

11. The switched capacitor circuit of claim 9, wherein the delay unit is configured to prevent an oscillation voltage of the node from being lower than zero.

12. The switched capacitor circuit of claim 9, wherein when the switch unit is turned off according to the delayed control signal, the inverting control signal is not coupled to the node except through a leakage current path of the switch unit.

13. A method for controlling a switched capacitor circuit, the switched capacitor circuit comprising a capacitor coupled between an output port and a node, the method comprising:
receiving a control signal;
generating an inverting control signal corresponding to the control signal according to the control signal;
delaying a first input signal to generate the delayed first input signal; and
selectively coupling a second input signal to the node according to the delayed first input signal, wherein the first input signal is determined by one of the control signal and the inverting control signal, and the second input signal is determined by the other of the control signal and the inverting control signal;
wherein after a signal level of the control signal is switched, a signal level of the delayed first input signal is switched at a time later than a time at which a signal level of the second input signal is switched.

14. A switched capacitor circuit, comprising:
an inverter, for receiving a control signal to generate an inverting control signal corresponding to the control signal;
a first capacitor, coupled between a first output port and a first node;
a delay unit, configured to delay a first input signal to generate the delayed first input signal;
a first switch unit, coupled to the delay unit, the first switch unit arranged for receiving the delayed first input signal and a second input signal, and selectively coupling the second input signal to the first node according to a delayed first input signal;
a second capacitor, coupled between a second output port and a second node;
a second switch unit, coupled to the delay unit and coupled between the first node and the second node, for selectively coupling the first node to the second node according to the delayed first input signal; and
a third switch unit, coupled to the delay unit, for receiving the delayed first input signal and the second input signal, and selectively coupling the second input signal to the second node according to the delayed first input signal;
wherein the first input signal is determined by one of the control signal and the inverting control signal, and the second input signal is determined by the other of the control signal and the inverting control signal.

15. The switched capacitor circuit of claim 14, wherein a delay time by which the first input signal is delayed is determined according to an impedance of the first capacitor and an impedance of the first switch unit, or determined according to an impedance of the second capacitor and an impedance of the third switch unit.

* * * * *